United States Patent [19]
Elfving et al.

[11] 3,943,553
[45] Mar. 9, 1976

[54] THERMOELECTRIC ASSEMBLY AND THERMOELECTRIC COUPLES AND SUBCOUPLES THEREFOR

[76] Inventors: Sven T. Elfving, 1560 Sandburg Terrace, Apt. 501, Chicago, Ill. 60610; Thore M. Elfving, 433 Fairfax Ave., San Mateo, Calif. 94402

[22] Filed: Dec. 16, 1974

[21] Appl. No.: 533,258

Related U.S. Application Data
[63] Continuation of Ser. No. 370,047, June 14, 1973, abandoned.

[52] U.S. Cl. ............... 357/28; 357/68; 357/80; 357/81; 136/211; 136/212; 136/225; 357/82
[51] Int. Cl.² H01L 23/56; H01L 23/48; H01V 1/30; H01V 1/00
[58] Field of Search ........... 357/28, 68, 80, 81, 82, 357/87; 136/211, 212, 225

[56] References Cited
UNITED STATES PATENTS

| | | |
|---|---|---|
| 3,379,577 | 4/1968 | Bird .......................... 357/28 |
| 3,392,439 | 7/1968 | Sonnenschein ............ 357/28 |
| 3,411,955 | 11/1968 | Weiss ........................ 357/28 |
| 3,524,771 | 8/1970 | Green ....................... 357/28 |
| 3,531,330 | 9/1970 | Elfving ...................... 357/28 |

*Primary Examiner*—Stanley D. Miller, Jr.
*Assistant Examiner*—E. Wojciechowicz
*Attorney, Agent, or Firm*—Flehr, Hohbach, Test, Albritton & Herbert

[57] ABSTRACT

A thermoelectric assembly including a plurality of N-type and P-type semiconductor bodies interconnected by junction bridge elements. The junction bridge elements are in the form of thin sheets or plates of conductive material disposed edgewise with respect to the bodies and connected thereto by means of lips or tabs which extend perpendicular to the plane of the junction bridge element. A frame for directly engaging and holding the junction bridge elements and heat dissipating and absorbing means cooperate with the edges of the bridge elements.

16 Claims, 8 Drawing Figures

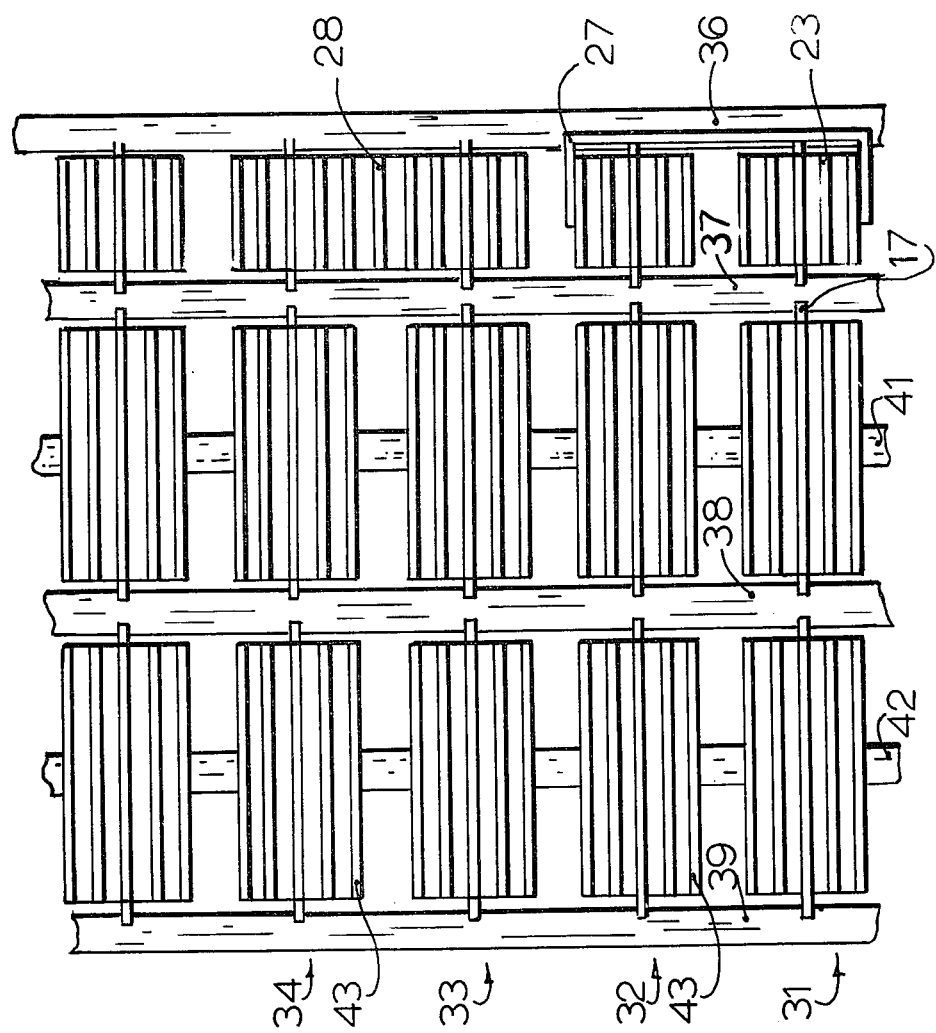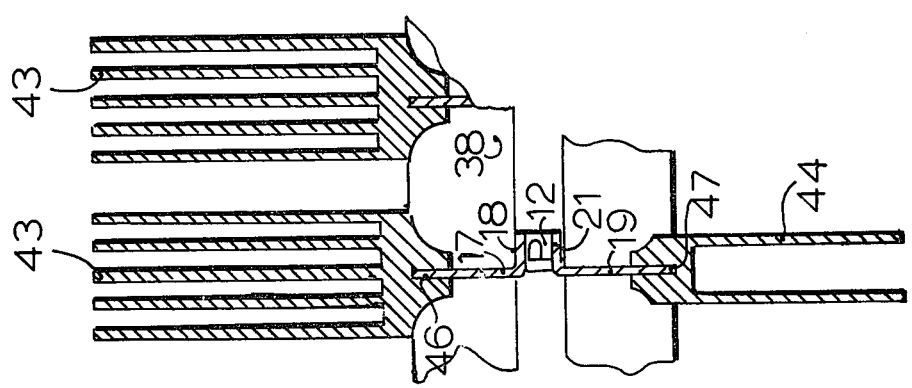

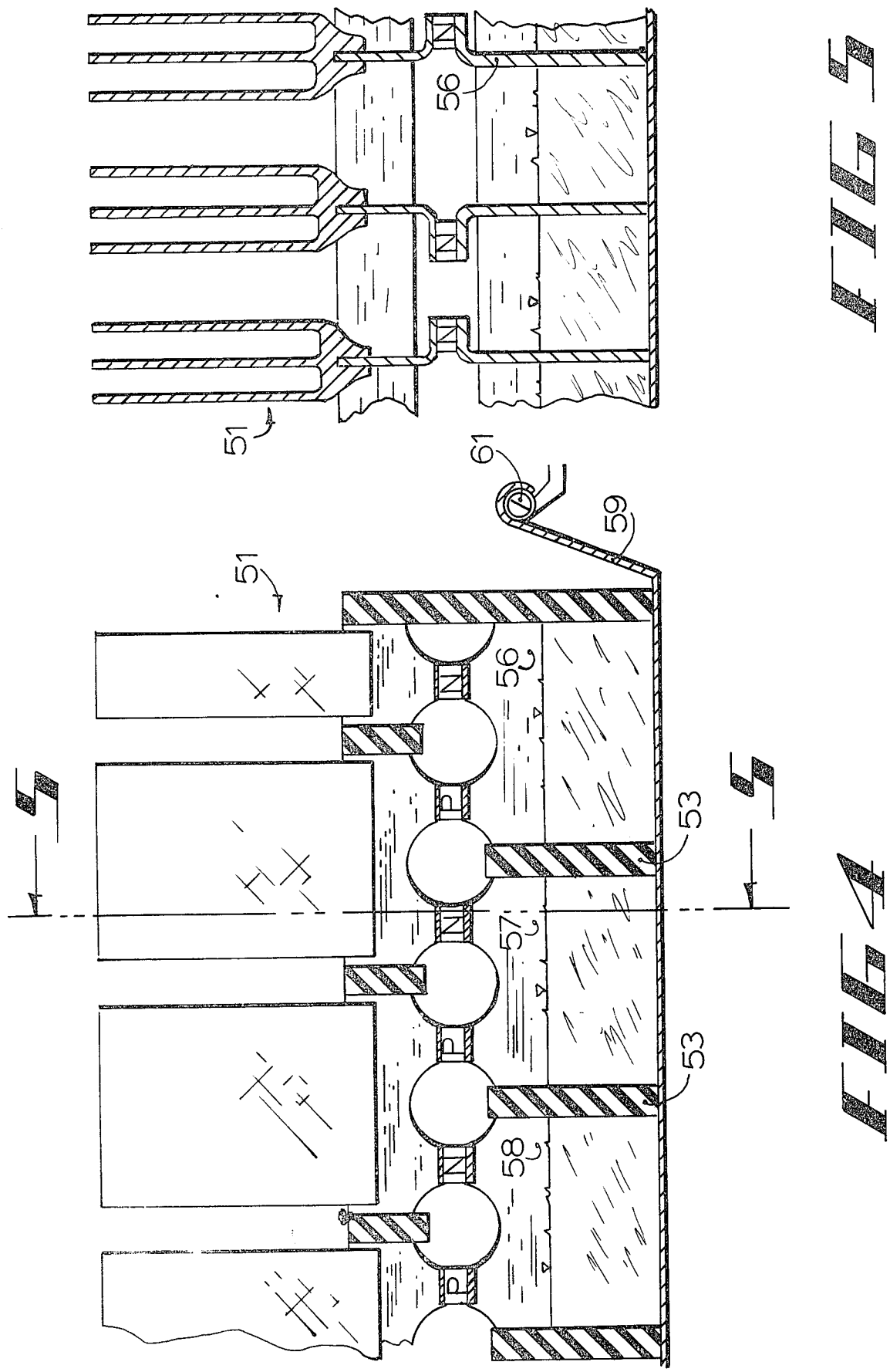

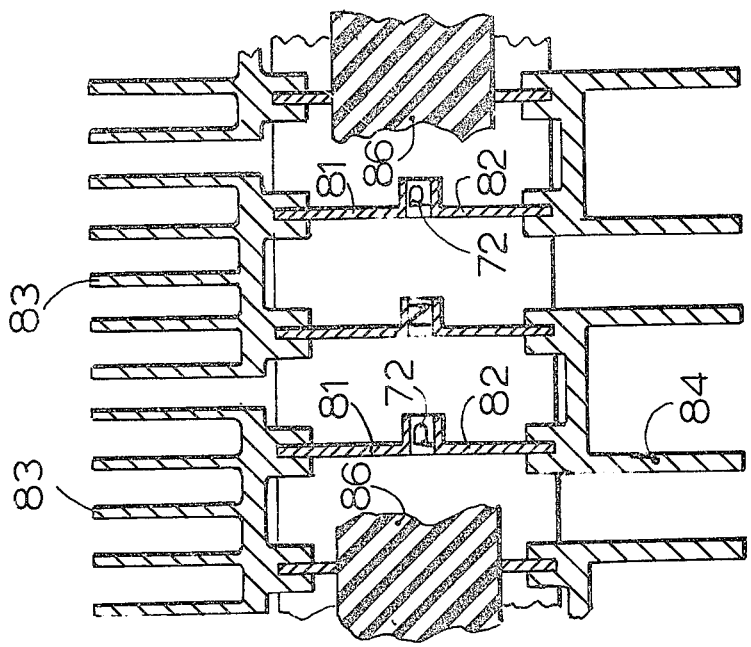
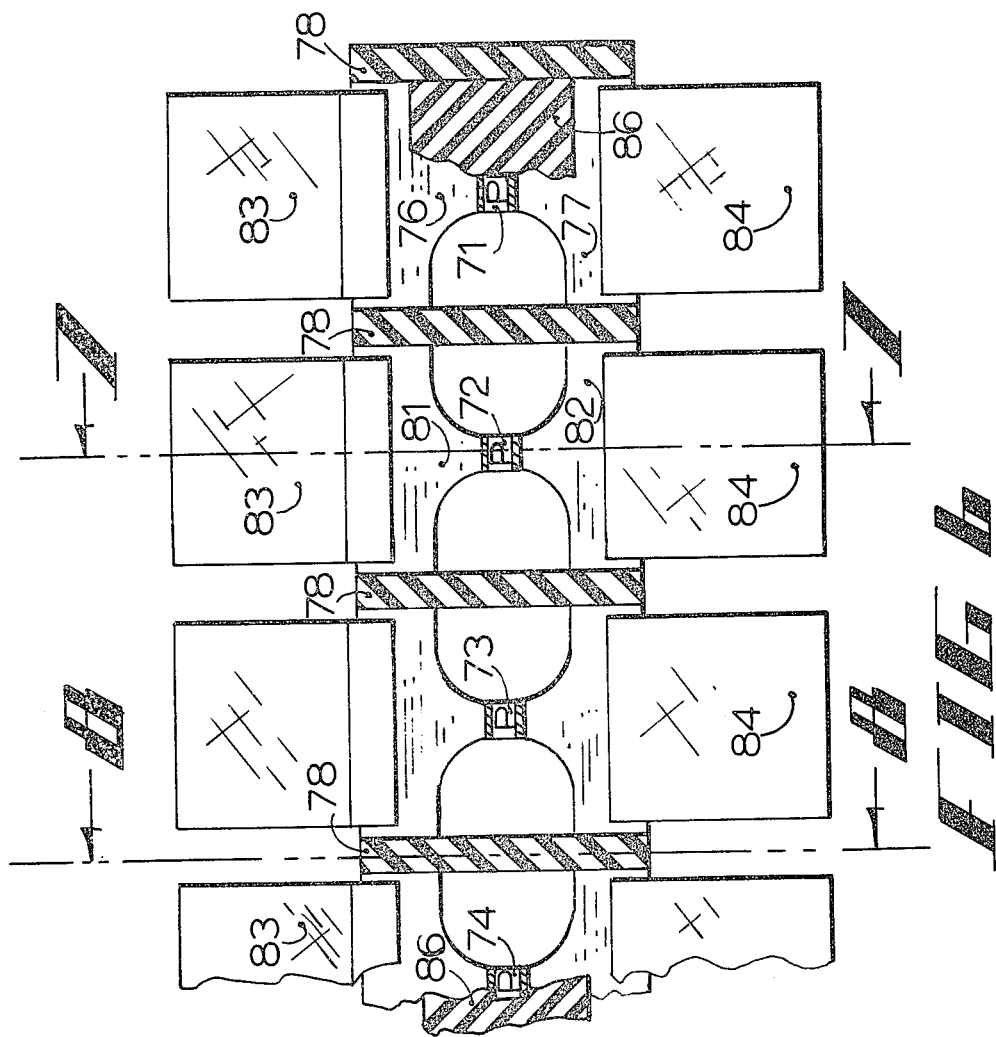

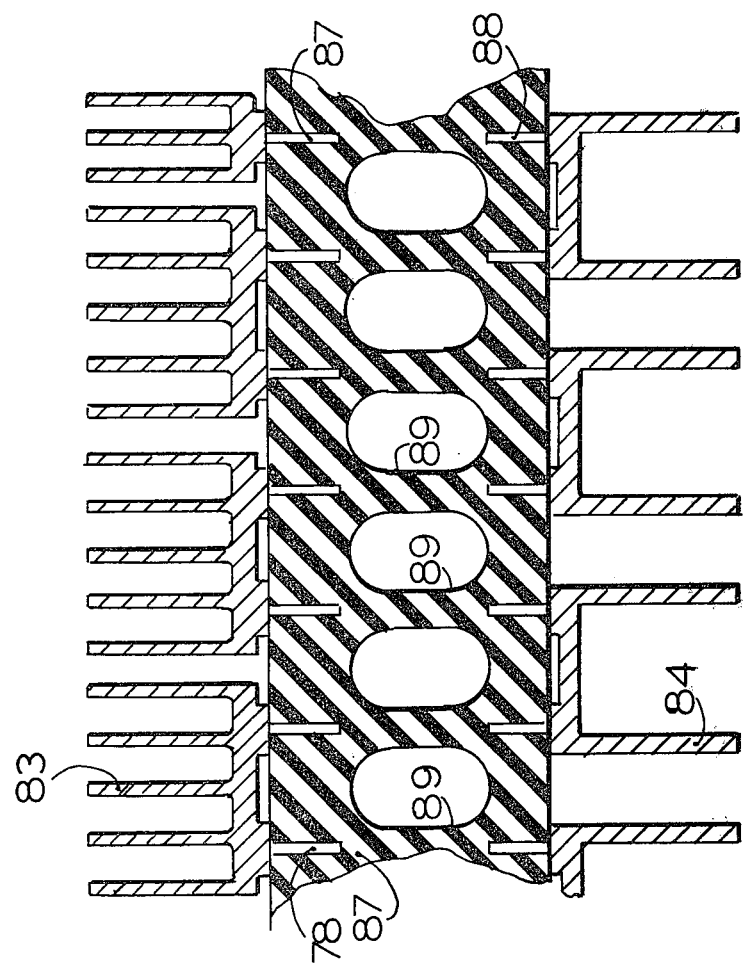

3,943,553

THERMOELECTRIC ASSEMBLY AND THERMOELECTRIC COUPLES AND SUBCOUPLES THEREFOR

CROSS REFERENCE TO RELATED APPLICATION

This application is a continuation of application Ser. No. 370,047, filed June 14, 1973, now abandoned.

BACKGROUND OF THE INVENTION

The present invention relates generally to thermoelectric assemblies and more particularly to thermoelectric heat pumps and thermoelectric couples and thermoelectric subcouples to be used in connection with thermoelectric heat pumps.

Thermoelectric modules or assmeblies employ a plurality of thermoelectric couples interconnected to form junction bridges. The modules or assemblies are provided with heat transfer radiators which are electrically isolated from the junction bridges by suitable insulating material such as a ceramic layer. Such thermoelectric assemblies have reduced efficiency because of interface losses between the hot and cold junction bridges in the module and because of the temperature drops across the insulating layers. In general, the thermoelectric assemblies are difficult to assemble and are relatively expensive.

OBJECTS AND SUMMARY OF THE INVENTION

It is a general object of the present invention to provide a simple, inexpensive, highly efficient, strong heat pump assembly.

It is another object of the invention to provide thermoelectric assemblies having a minimum number of different inexpensive parts forming the couples.

It is another object of the invention to provide a strong simple assembly formed by rigidly securing novel junction bridge elements to or between frames or strips of a solid and atrong non-conductive material.

It is still another object of the invention to provide thermoelectric assemblies with minimum interface losses between the hot and cold sides by reducing the size of the interface surfaces between the hot and cold junction sides of the assembly.

The above and other objects are achieved by a thermoelectric assembly which includes a plurality of thermoelectric couples including bodies of P-type and N-type semiconductor material interconnected by junction bridge elements formed of a thin sheet or plate of conductive material disposed edgewise with respect to the thermoelectric bodies whereby to present minimal interface surface areas between the semiconductor bodies and the junction bridge elements. The junction bridge elements may each include a lip or tab extending at right angles to the plane of the junction bridge for connecting to surfaces of the semiconductor bodies. Frames serve to engage the edges of the junction bridge elements to provide a relatively strong assembly. Heat dissipating and absorbing means cooperative with the edges of the junction bridges.

Other features of the invention serving to improve thermoelectric assemblies as well as further objects and advantages and features of novelty will be apparent from the following description.

BRIEF DESCRIPTION OF THE DRAWING

FIG. 2 is a sectional view taken along the line 2—2 of FIG. 1.

FIG. 3 is a partial top view of the assembly of FIG. 1.

FIG. 4 is a partial view, partly in section, of an ice freezer incorporating the present invention.

FIG. 5 is a sectional view taken along the line 5—5 of FIG. 4.

FIG. 6 is a partial view, partly in section, of another embodiment of the invention.

FIG. 7 is a sectional view taken along the line 7—7 of FIG. 6.

FIG. 8 shows a sectional view along the line 8—8 of FIG. 6.

DESCRIPTION OF PREFERRED EMBODIMENT(S)

Figure 1:
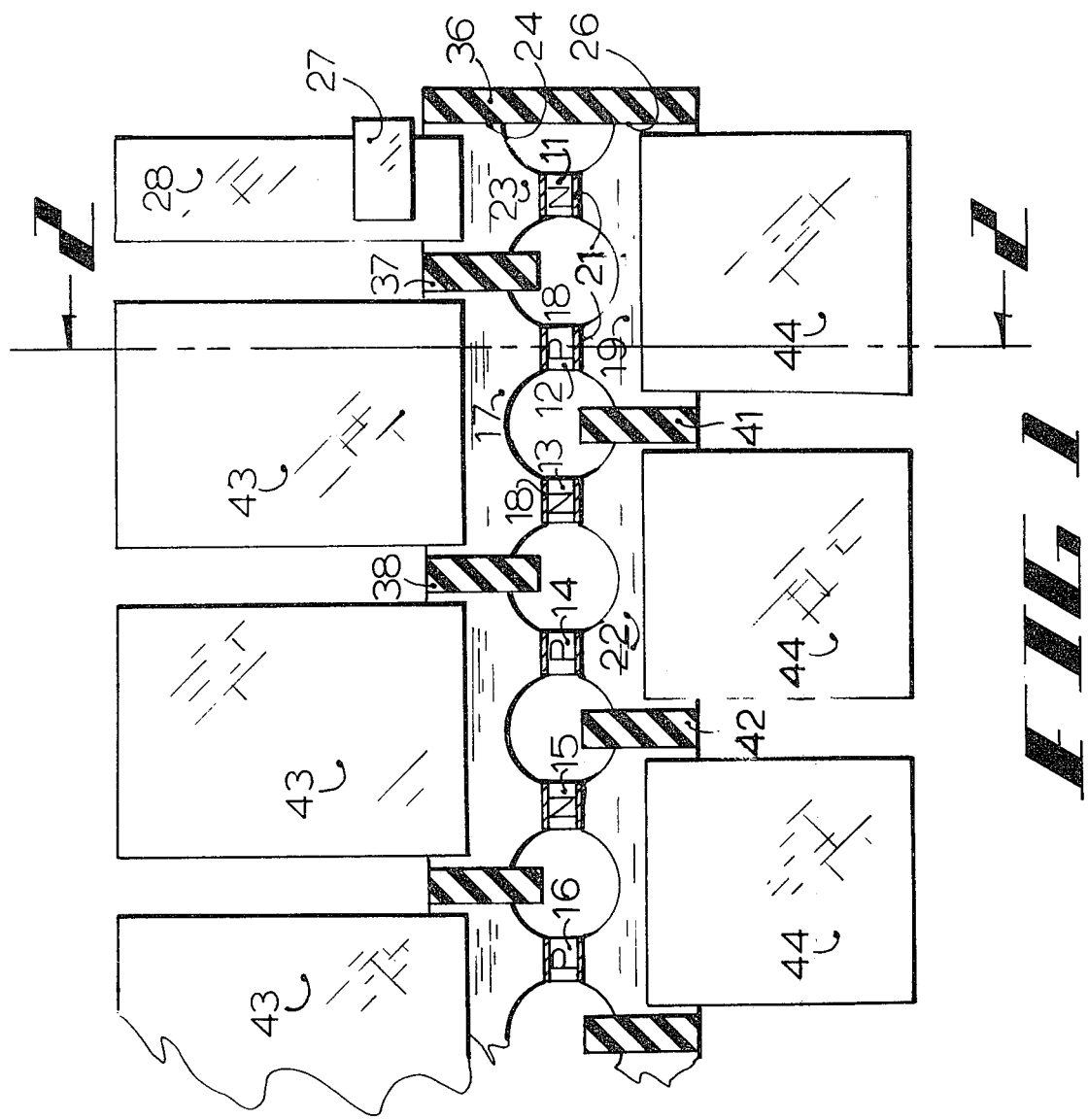
FIG. 1 is a partial view, partly in section, of a row of thermoelectric couples mounted between rigid frames of a non-conductive material in accordance with the invention.

A thermoelectric assembly employing semiconductor bodies or elements 11, 12, 13, 14, 15 and 16 of alternating N-type and P-type semiconductor material is shown. The bodies have opposite sides soldered or otherwise electrically connected to conductive junction bridge elements, preferably of copper. The junction bridge elements are formed from a thin sheet or plate of conductive material having a narrow lip or ear protruding at right angle to the sheet adapted to contact one face of the semiconductor body for electrical contact and presenting the edge of the sheet or plate to the semiconductor body.

Referring to FIGS. 1-3, a junction bridge 17 has its ears 18 connected to the hot side of semiconductor P-type and N-type bodies 12 and 13, respectively. The junction bridge element 17 is in the form of a thin sheet or plate disposed edgewise to the semiconductor bodies attached to the junction bridge at contact member 18. The contact member, which can be a bent portion of the sheet element or an added member which can be a lip, ear or tab, protrudes art a right angle with respect to the body thereby creating a flat contact surface parallel to the surface of the semiconductor body. preferably, the members 18 have substantially the same area and shape as the body itself. As seen from FIG. 1, each junction bridge has two such protruding lips for receiving semiconductor bodies of opposite type. On the cold side, the semiconductor body 12 is joined to semiconductor body 11 of opposite conductivity type by a similar junction bridge element 19 including spaced lips 21. The semiconductor body 13 is joined on the cold side to a semiconductor body 14 of opposite conductivity type by a junction bridge 22. The remainder of the semiconductor bodies are connected to similar junction bridges.

FIG. 2 shows the junction bridges 17 and 19 with lips 18 and 21 attached to opposite faces of the semiconductor body 12. The semiconductor bodies 11, 12, 13, 14, 15, 16, etc., are connected in series whereby direct current can be applied to the semiconductor bodies to form a heat pump. The electric current may enter the row shown in FIG. 1 on the hot side of the body 11 which is provided with only half a junction bridge 23 so that the edge 24 is in line with the edge 26 of bridge element 19. In an assembly the half junction bridge element 23 is connected by a connector 27 to a similar junction bridge element in a neighboring row of junction bridges so that all the rows in the panel are in series. The connector may also have the form of an aluminum radiator section 28 in common for two half adjacent bridge elements. The distance between the semiconductor bodies in each row of an assembly and the distance between the lips or ears on the junction bridges are equal so that an equal spacing is present between adjacent bridge elements.

FIG. 3 is a top view of a portion of a panel using rows 31, 32, 33, 34, etc., of couples according to FIG. 1. The row of FIG. 1 is shown as row 31 of FIG. 3 which shows how the junction bridge elements 17 and 23 have their edges inserted in non-conductive strips 36, 37, and 38. The frame 38 is also shown in FIG. 2. In the same way, the junction bridge elements 19 and 22 have their edges affixed to similar frames 36, 41 and 42. At the end of the row the half junction bridge element 23 is shown having a bakelite strip 36 in common with the bridge element 19.

The hot and cold side non-conductive frames can be interlocked in any suitable way to form a rigid and strong structure to protect the panel from damage through impacts or stress.

Again referring to FIGS. 1–3, the junction bridge elements are provided with aluminum radiators for heat dissipation and heat absorption. The radiators 43, 44 are preferably extruded and provided with grooves 46, 47 for receiving the edges of the bridge elements as illustrated.

The radiator 43 on the hot side has a surface which is considerably larger than the surface on the cold side of radiator 44 in view of the much larger amount of heat dissipated on the hot side than absorbed on the cold side. The extruded aluminum radiator sections can be given various shapes and sizes. By inserting the blade-like junction bridge element in a tight fitting groove or slot in the alimunum profile, a good thermal connection is obtained without clamping or soldering. This simple and inexpensive mounting of radiators according to the invention can be aided by using known means for increasing the heat transmission at the contact between the radiator groove and the edge of the bridge element. FIG. 3 shows the connector 27 which connects a half junction bridge element on the hot side with another half bridge element on the same side of an adjacent row. The two half elements thereby form a complete junction bridge. A metal radiator could also serve as the connector between rows of the assembly.

Referring to FIGS. 4 and 5, there is shown a sectional view of a heat pump assembly suitable for ice freezing. The assembly has a hot side 51 of essentially the same type as the assembly shown in FIG. 1. The cold side junction bridges are modified. Instead of having radiators 44 (FIG. 1), the bridge elements are extended downwards between extended frames 53. Junction bridges 56, 57 and 58 extend between spaced frames 53. The junction bridges and frames are submerged in the water to be frozen in ice tray 59 placed under the assembly in a position where the bottom of the non-conductive ice tray touches the lower edges of the junction bridges and frame structure. When filled with water up to the indicated level, ice will form on both sides of the junction bridge elements until the space between the bridge elements and the frames is filled with ice.

FIG. 5 illustrates the distance between the junction bridge elements of adjacent rows which determines the other dimension of the ice cubes. The other dimensions being determined by the distance between the frames and the water level.

The ice can be released from the panel by reversing the direction of the electric current so that the cold junction bridges are heated instead of cooled. After thawing, the ice may be removed from the panel to a storage area simply by swinging the ice tray away from the panel. For this purpose, the ice tray 59 may be hinged one side around the axis 61. When the tray is lowered from the thermoelectric assembly, the ice will fall. The swinging motion of the ice drawer away from the panel can be actuated by a spring which moves the drawer as soon as the ice is thawed at the junction bridges. After release of the ice, the ice tray can be swung back into freezing position and automatically filled with water from a source of water communicating with the tray. The source may comprise a filling tank in which the water level is constant and in such relation to the water intake at the tray that the flow of water is interrupted when the tray is in a lowered position and started when the tray is in the freezing position. The different positions of the tray 59 can be achieved by a handle outside the ice freezer. Rotation of the handle also controls switching of the electric current. The freezing period can be controlled by a time switch which reverses the current and thereby also releases the frozen ice. Refrigeration panels according to the invention may be provided with a foam type insulation in the middle of the panel between the hot and cold junction sides. For simplicity of illustration, the insulation is not shown in the Figures.

Another thermoelectric assembly according to the invention is shown in FIGS. 6–8. The assembly includes semiconductor bodies 71, 72, 73 and 74, each soldered or otherwise electrically connected to conductive junction bridge elements, preferably copper, on both their hot and cold junction sides to form subcouple assemblies comprising a single semiconductor body of either N-type or P-type. The body 71 is, for instance, connected with half junction bridge elements 76 and 77 on its hot and cold junction side or face, respectively. The edges of the junction bridge elements may be secured to spaced insulating members 78 to form a row of subcouples. As is well known, each subcouple must be connected in series with another subcouple of dissimilar type in order to form a thermoelectric couple with hot and cold sides. The subcouple including the semiconductor body 71 can be connected to a subcouple in an adjacent row, held between another spaced pair of insulating frames. Subcouple 71 can be connected to subcouple 72 by a connector extending between the bridge elements on the hot side assuming that the subcouple 72 is of dissimilar type. Such a connector can be of a very simple type crossing over or through the non-conducting frame 78 separating the subcouples. The bridge element 76 on the hot side of semiconductor body 71 can also be extended through a slot in the frame 78 so that the hot side bridge element 81 of semiconductor body 72 is simply a continuation of the bridge element 76. In this event, the subassembly comprises a complete thermocouple of the same type as described in FIGS. 1 and 4 with the difference that the junction bridge element is secured to frames not only along its edges but also in the middle where it is passing through the slot in frame 78.

According to the invention, it is also possible to connect subcouples located between the same pair of frames 78 to form complete couples. As an example, a couple can be formed by connecting the hot side bridge element 81 with the hot side of the next subcouple and likewise the cold side element 82 with the cold side element of the adjacent subcouple. In thie way all the subcouples between a pair of frames 78 are connected alternately on the hot and cold junction sides to form thermocouples in series, as illustrated in FIG. 7 where it is shown how subcouples can be connected simply by providing adjacent bridge elements with metal heat transfer radiators 83 and 84 in common. Thus, on the hot side of subcouple 72 a radiator 83 serves as a connector to an adjacent subcouple while on the cold side a heat absorbing radiator 84 performs in the same way. The radiators in common are provided with grooves to receive the edges of the respective bridge elements so that a good heat transmission is obtained as well as a good electric contact.

The thermoelectric assembly according to FIGS. 6 and 7 is relatively strong because of the cooperation of the bridge elements, metal radiators and rigid non-conductive frames. Only at the end of a row is it necessary to connect the end bridge element with a bridge element of an adjacent row to provide series connection between rows. It is, of course, apparent as described above that the connection between subcouples and couples supported in the insulating frame may be along rows of couples or subcouples or across rows.

In FIG. 6 a foam type heat insulation 86 is disposed between the hot and cold side of the assembly according to the invention.

As seen from the figures, this foam insulation has a larger thickness than the semiconductor bodies and extends along the bridge element towards the connecting radiators on both sides. The adhesion between the insulation and the copper bridge element is strong and the foam is sufficient to support said elements mechanically and thus replace the described frame structure. The foaming can take place while the metal parts of the subcouples including the semiconductor bodies in FIGS. 6 and 7 are held in position by a suitable fixture. After the foaming, the surface of the insulation can be suitably treated or reinforced so that the subcouples dispersed in the foam insulation are additionally supported. The interconnection of the subcouples to form couples in series and a refrigeration panel can, according to the invention, later take place as shown in FIG. 7 by means of radiators 83 and 84 in common for alternating pairs of subcouples.

Referring to FIG. 8, the frame 78 is provided with grooves 87 and 88 for receiving the edges of the hot side and cold side copper junction bridge elements. The figure shows how the insulating frames, which may be phenolic or plastic, are provided with holes 89 between the grooves in order to reduce the heat flow in the frame between its hot and cold sides. The area left between the grooves for passage of heat can be much smaller than indicated on the drawing and the heat losses reduced to an absolute minimum.

The invention is not limited to the specific designs of junction bridge elements shown in the figures but includes the general use of junction bridge elements placed substantially edgewise to the semiconductor bodies and supported between adjacent frames of a non-conductive material such as plastics or phenolics. The junction bridge elements according to the invention are uniquely suitable for connection to heat dissipating or heat absorbing fin elements without clamping or soldering by inserting their thin edges into grooves formed in the fin elements.

Another important feature of the invention is the use of individually secured subcouples connected into couples by metal heat radiators or heat sinks in common.

Assemblies according to the invention lend themselves particularly well to the building of thermoelectric cascades in two or more stages. The hot side of the second stage can easily be thermally connected to the cold side of the couples or subcouples of the first stage through the sheet-like junction bridge elements. By repeating the structure used in the first stage in the second stage, and so on, a simple cascade with a minimum of interface and other losses can be built at lower cost than previously possible.

The present invention can be applied to both small and large capacity assemblies suitable for household refrigerators as well as for other refrigeration purposes, water coolers, ice freezers, air conditioners, and the like. Units of different types for roof applications or wall mounting can be built at low cost.

Assemblies according to the invention make it also possible to mass manufacture power generators of very simple type by passing hot gases over one junction side and a cooling medium over the other junction side.

Thus, there has been provided a simple, inexpensive, highly efficient thermoelectric heat pump assembly and couples and subcouples for use therewith.

We claim:

1. A thermoelectric assembly comprising semiconductor bodies of P-type and N-type semiconductor material each having hot and cold sides of predetermined area with similar sides adapted to be connected in series by junction bridges to form thermocouples, characterized in that a contact member of substantially the same size and shape is secured to and contacts substantially the entirety of each of the sides of said bodies of semiconductor material, said junction bridges each having substantially the form of a thin sheet metal element disposed edgewise with its surfaces at substantially right angles with respect to the associated side and contact member of the semiconductor body with one edge in conductive contact with the contact member of the associated surface of an associated semiconductor body and with the other edge adapted to be associated with heat exchange means to the surrounding media, and a non-conductive supporting structure directly engaging said metal elements to support and protect the thermoelectric assembly.

2. A thermoelectric assembly as in claim 1 wherein said junction bridges each comprise a pair of thin sheet metal elements one connected to a P-type semiconductor body and the other to an N-type semiconductor body and connecting means for interconnecting the thin sheet metal elements to form junction bridges and connect the semiconductor bodies in series.

3. A thermoelectric assembly as in claim 1 wherein said junction bridges each comprise a single thin sheet metal element having one edge in conductive contact with one surface of a P-type and an N-type semiconductor body.

4. A thermoelectric assembly as in claim 1 including at least on one side a finned heat transfer member including a groove adapted to engage the other edge of an associated junction metal bridge element.

5. A thermoelectric assembly as in claim 1 wherein the thin sheet metal junction bridges connected to the cold junction side are extended to form a heat exchange means.

6. A thermoelectric assembly as in claim 5 wherein the extended junction bridges are adapted to be placed in contact with water for cooling or freezing the water.

7. A thermoelectric heat pump as in claim 1 wherein said one edge of said metal element in conductive contact with a semiconductor body includes a tab extending perpendicularly outward from the element and contacting the surface of the semiconductor body, said tab having substantially the same size and shape as the surface of the semiconductor body.

8. A thermoelectric subcouple as in claim 1 in which said one edge of the thin sheet metal bridge element includes a narrow portion extending to and contacting the contact member.

9. A thermoelectric assembly comprising semiconductor bodies of N-type and P-type material having hot and cold surfaces connected in series by junction bridge elements to form thermocouples, said junction bridge elements having the form of thin metal elements having one edge in electrical and thermal contact with said surfaces and disposed edgewise with respect thereto with their surfaces substantially perpendicular to the surface of the semiconductor bodies and the other edge adapted to associate with heat exchange means, the hot and cold junction bridge elements having a minimum interfacing surface area whereby to minimize looses by heat exchange between the same.

10. A thermoelectric assembly as in claim 9 wherein said junction bridge elements each comprise at least a pair of metal thin elements one connected to a P-type semiconductor body and the other to an N-type semiconductor body and connecting means for interconnecting the metal elements to form junction bridges and connect the semiconductor bodies in series.

11. A thermoelectric assembly as in claim 9 wherein said junction bridges each comprise a single metal element with said one edge in contact with one surface of a P-type and an N-type semiconductor body.

12. A thermoelectric assembly as in claim 9 including heat transfer means in the form of finned heat transfer members each including an elongated groove adapted to engage the other edge of an associated metal bridge element.

13. A thermoelectric assembly as in claim 9 wherein said thin sheet metal junction bridges connected to the cold junction side are extended and adapted to be immersed in a fluid such as water to cool or freeze the same.

14. A thermoelectric assembly as in claim 1 in which the non-conductive supporting structure comprises a foam insulation directly engaging both sides of said sheet metal elements serving as junction bridges.

15. A thermoelectric assembly as in claim 1 wherein said non-conductive supporting structure comprises frame means directly engaging edges of said sheet metal element.

16. A thermoelectric assembly as in claim 7 wherein the junction bridge elements in the form of thin metal elements disposed edgewise to the surfaces of the semiconductor bodies are supported by a non-conductive structure in the form of a foam insulation directly engaging both sides of said thin metal elements.

* * * * *